United States Patent
Tell

(10) Patent No.: US 11,158,341 B2
(45) Date of Patent: Oct. 26, 2021

(54) FREQUENCY RESPONSE METHOD AND APPARATUS

(71) Applicant: SOUNDTHEORY LIMITED, Oxford (GB)

(72) Inventor: Andreas Oliver Tell, Freiburg (DE)

(73) Assignee: SOUNDTHEORY LIMITED, Oxford (GB)

( * ) Notice: Subject to any disclaimer, the term of this patent is extended or adjusted under 35 U.S.C. 154(b) by 0 days.

(21) Appl. No.: 16/770,609

(22) PCT Filed: Dec. 12, 2018

(86) PCT No.: PCT/AU2018/051328
§ 371 (c)(1),
(2) Date: Jun. 7, 2020

(87) PCT Pub. No.: WO2019/119028
PCT Pub. Date: Jun. 27, 2019

(65) Prior Publication Data
US 2021/0174833 A1 Jun. 10, 2021

(30) Foreign Application Priority Data
Dec. 22, 2017 (AU) .............................. 2017905153

(51) Int. Cl.
*H03H 21/00* (2006.01)
*H04R 3/00* (2006.01)
(Continued)

(52) U.S. Cl.
CPC ...... *G11B 20/10046* (2013.01); *G06F 17/141* (2013.01); *H03G 5/165* (2013.01);
(Continued)

(58) Field of Classification Search
CPC . H04R 3/00; H04R 3/04; H03H 21/00; H03H 21/012; H03H 21/002;
(Continued)

(56) References Cited

U.S. PATENT DOCUMENTS 5,416,846 A * 5/1995 Tamura ............ G10K 11/17854
381/71.8
9,082,389 B2 * 7/2015 Nicholson ........ G10K 11/17854
(Continued)

OTHER PUBLICATIONS

Australian Patent Office, International Search Report, ISA/210, PCT/AU2018/051328, dated Mar. 13, 2019, Woden Act 2606, Australia.
(Continued)

*Primary Examiner* — Thang V Tran
(74) *Attorney, Agent, or Firm* — Louis Ventre, Jr.

(57) ABSTRACT

The invention provides a method and apparatus for filtering a temporal signal. A target magnitude frequency response $H_T(f)$ is specified (101,201) of frequency f in terms of a column vector l of K weights $l_k$ where $\log H_T(f) = l^T W(f)$ and W(f) is a column vector of K magnitude basis functions $W_k(f)$. A constrained frequency response $H_c(f)$ is computed (102,214) defined by $\log H_c(f) = g^T V(f)$, where V(f) is a column vector of N constrained basis functions $V_n(f)$ for which each $\exp g_n V_n(f)$ satisfies a constraint preserved by concatenation, and g is a column vector of N coefficients satisfying a matching criterion between $l^T W(f)$ and $g^T V(f)$. An input temporal signal is received (103,212) and filtered (104,210) with the constrained frequency response $H_c(f)$ to form a filtered temporal signal; and the filtered temporal signal is output (105,211).

19 Claims, 3 Drawing Sheets

(51) Int. Cl.
*G11B 20/10* (2006.01)
*G06F 17/14* (2006.01)
*H03G 5/16* (2006.01)
*H04R 3/04* (2006.01)

(52) U.S. Cl.
CPC ...... *H03H 21/002* (2013.01); *H03H 21/0012* (2013.01); *H03H 21/0025* (2013.01); *H04R 3/04* (2013.01)

(58) Field of Classification Search
CPC .......... H03H 21/0025; H03H 21/0043; H03H 17/0294; H03H 17/0227; G10L 25/03; G10L 25/18; G10L 25/48; H04S 7/307; G06F 17/141; H03G 5/165; H03G 9/025; G11B 20/10046
See application file for complete search history.

(56) References Cited

U.S. PATENT DOCUMENTS

| | | | | |
|---|---|---|---|---|
| 2002/0163959 | A1* | 11/2002 | Haddad | H03H 17/0213 375/229 |
| 2002/0181554 | A1* | 12/2002 | Kim | H04B 1/71055 375/147 |
| 2009/0097679 | A1* | 4/2009 | Maeda | H04S 7/30 381/302 |
| 2011/0007907 | A1* | 1/2011 | Park | G10K 11/17881 381/71.8 |
| 2011/0103590 | A1 | 5/2011 | Christoph et al. | |
| 2013/0114830 | A1 | 5/2013 | Eastty | |
| 2013/0259250 | A1 | 10/2013 | Nicholson et al. | |
| 2014/0161281 | A1 | 6/2014 | Nackvi | |
| 2015/0312595 | A1* | 10/2015 | Vanam | H04N 19/117 375/240.29 |
| 2018/0254053 | A1* | 9/2018 | Shi | H03H 21/0043 |
| 2019/0149920 | A1* | 5/2019 | Putzeys | H04R 29/003 381/55 |

OTHER PUBLICATIONS

Australian Patent Office, Written Opinion of the International Search Authority, ISA/237, PCT/AU2018/051328, dated Mar. 13, 2019, Woden Act 2606, Australia.

Radlovic et al., "Nonminimum-Phase Equalization and Its Subjective Importance in Room Acoustics", in IEEE Transactions on Speech and Audio Processing, vol. 8(6), Nov. 2000, pp. 728-737; DOI: 10.1109/89.876311.

Valimaki et al., "All About Audio Equalization: Solutions and Frontiers" Applied Sciences, vol. 6(5), 129, May 2016; DOI: 10.3390/app6050129.

Europoean Patent Office, Extended European Search Report dated Jul. 19, 2021, EP Application 18892628.1-1210/3704690, PCT/AU2018051328, Munich, Germany.

Maestre Esteban, et al: "Design of Recursive Digital Filters in Parallel Form by Linearly Constrained Pole Optimization", IEEE Signal Processing Letters, vol. 23, No. 11, Nov. 1, 2016, pp. 1547-1550, XP011623776, ISSN: 1070-9908, DOI: 10.1109/LSP.2016.2605626 [retrieved on Sep. 20, 2016), II. Design of Parallel Filters from a Fixed Pole Set, II. Optimization of Pole Positions IEEE Service Center, Piscataway, NJ, US.

Vesa Valimaki, et al: "All About Audio Equalization: Solutions and Frontiers", Applied Sciences, vol. 6, No. 5, May 6, 2016 (May 6, 2016), p. 129, XP055615841, DOI: 10.3390/app6050129, published online at www.mdpi.com/journal/applsci.

* cited by examiner

FREQUENCY RESPONSE METHOD AND APPARATUS

FIELD

The present invention relates to processing of temporal signals, including synthesised or measured temporal signals, in particular to an improved apparatus and method for adjusting a frequency response applied to a temporal signal to match a target magnitude frequency response. Applications of the invention include systems where a target magnitude frequency response is required to be dynamically altered according to user input, such as in a graphic equaliser for an audio system where the temporal signal is an audio signal. Applications further include where a magnitude frequency response is required to be dynamically altered or according to an algorithm such as computational auditory perception model applied to a changing input temporal signal to maintain, optimise or match a model-derived perceptual characteristic of the temporal signal. The invention may be implemented in the audio field for example in a system for mastering and mixing in an audio production, an audio entertainment system or a hearing aid. Other applications outside of the audio field include adaptive channel equalisation in digital communications, where the temporal signal is a digital communication signal.

BACKGROUND

Techniques and systems for alteration of the frequency response of audio systems to meet particular requirements or preferences have a long history. The term "equalisation" or "EQ" is used to refer to the general task of changing the balance of frequencies in a signal, whether or not performed for the purpose of correction to take account of characteristics of hardware such as analogue transmission lines, speakers or microphones, or whether to change the characteristic of sound to a more pleasing or clearer rendition. The audio practitioner using audio mixing equipment can boost or cut the bass, cut or boost the high frequencies, or play with the mid-range frequencies to improve the resultant sound.

Graphic equalisers used by sound engineers are based around a number of serially chained frequency peaking filters called bands, either with fixed bandwidth or proportional Q responses, usually spaced by a half, a third, or a whole octave, depending on the number of bands. Each band is controlled using a physical or vertical slider, which governs the cut or boost, with 'flat' being in the centre position—so the name 'graphic equaliser' comes about because the sliders show the general shape of the EQ curve, which is the target magnitude frequency response. Individual filter bandwidths are arranged so that they overlap smoothly, while the highest and lowest frequency sliders are usually linked to shelving filters to provide more useful control over the high and low extremes. In principle, with a large enough number of bands, graphic equalisers can for all practical purposes produce any relevant magnitude frequency response.

Linear phase systems are systems which introduce no frequency dependent phase delay to the signal and can be designed in digital implementations by using just the target magnitude frequency response directly. Linear phase equalisation produces certain artefacts associated with the fact that temporal smearing due to the frequency response curve occurs symmetrically in both time directions from the centre of an impulse. For example, a phenomenon known as "pre-ringing" occurs in percussive sounds such as drums were typically low frequency components appear to precede the percussion.

Because a target magnitude frequency response can result from an infinite range of complex frequency responses due to the phase freedom, other forms of equalisation are possible. In particular, minimum phase equalisation overcomes the pre-ringing problem and minimises related audible artefacts. While linear phase equalisation is still preferred for parallel signal paths where relative phase preservation between parallel paths is important, minimum phase equalisation is an important part of the toolkit of a sound engineer.

For a discrete time system with impulse response $h(n)$ with time sample n, minimum phase filters are causal filters ($h(n)=0$ for $n<0$) which minimise the tail impulse response $\Sigma_{n=k}^{\infty}|h(n)| \forall k>0$ while satisfying the target magnitude frequency response. The minimum phase criterion is satisfied for recursive discrete-time systems if and only if the poles and zeros of the z-transform of the frequency response where $z=\exp(i\omega)$, $\omega=2\pi fT$ are all inside the unit circle in the complex z plane, and more generally the minimum phase criterion is satisfied if the imaginary and real parts of the logarithm of the frequency response $H(\omega)$ are related by the Hilbert transform $\mathcal{H}$:

$$\text{Im} \log H(\omega) = -\mathcal{H}[\text{Re} \log H(\omega)] \quad (1)$$

The minimum phase criterion is preserved under system concatenation, so minimum phase equalisers can be built up by concatenation (multiplication) of minimum phase recursively implemented peaking or shelf filters, each a function of at least one gain parameter which is varied to provide a match with a desired outcome. Using such filters manually by the sound engineer to generate an approximate desired effect is straightforward, but if it is desired to exactly match a target magnitude frequency response, the calculation of the appropriate gain parameters for each filter stage is not straightforward.

This is because for a finite order filter, the shape of the band response depends strongly on the band again, creating a non-linear decomposition problem. There are iterative methods to deal with this, but reliable and rapid convergence is problematic, and convergence often cannot be guaranteed. While iterative procedures can generally quickly adapt to slowly changing target magnitude frequency responses, because the previous solution is generally close and requires only a few iterations to update, this creates the drawback that the matching solution is dependent not only on the target magnitude frequency response, but also the history of all responses before. Continuous refinement by iteration can also cause temporal oscillations in the solution, leading to audible artefacts in the processed audio signal. If it is desired to make a dynamically adjustable minimum phase system to match an arbitrary target magnitude frequency response which changes in real-time, deterministic and predictable behaviour of the matching algorithm is desirable.

While it may be in principle possible to directly calculate a minimum phase frequency response using equation (1) and a digital implementation of the Hilbert transform, such a calculation would be computationally inefficient and slow, and difficult to implement in real-time using standard low-cost computer hardware.

There is therefore a need to provide an improved method and apparatus for filtering an audio signal to produce minimum phase equalisation which overcomes one or more of the above-mentioned disadvantages of prior art methods.

SUMMARY OF THE INVENTION

In accordance with a first broad aspect of the invention, there is provided a method of filtering a temporal signal, the method comprising implementing on a digital signal processing device the steps of:

specifying a target magnitude frequency response $H_T(f)$ of frequency f in terms of a column vector l of K real number weights $l_k$ where $\log H_T(f) = l^T W(f)$ and $W(f)$ is a column vector of K magnitude basis functions $W_k(f)$;

computing a constrained frequency response $H_c(f)$ defined by $\log H_c(f) = g^T V(f)$, where $V(f)$ is a column vector of N constrained basis functions $V_n(f)$ for which each $\exp g_n V_n(f)$ satisfies a constraint preserved by concatenation, and g is a column vector of N coefficients satisfying a matching criterion between $l^T W(f)$ and $g^T V(f)$;

receiving an input temporal signal;

filtering the input temporal signal with the constrained frequency response $H_c(f)$ to form a filtered temporal signal; and outputting the filtered temporal signal.

In one embodiment, the matching criterion is a condition on one or more error measures between $l^T W(f)$ and $g^T V(f)$. The one or more error measures may comprise a measure of $e(f)$ defined by $l^T W(f) - g^T \mathrm{Re}\, V(f)$. The condition of the matching criterion is a minimisation with respect to variation of g, and the measure of $e(f)$ may be an inner product $\langle e, e \rangle$ where $\langle a, b \rangle$ is an integral or sum over f between functions $a(f)$ and $b(f)$, whereby g satisfies the matching criterion as $Ml$, where $M = \eta^+ C$, $\eta$ is an N by N matrix $\eta_{np}$ defined by $\langle \mathrm{Re}\, V_n, \mathrm{Re}\, V_p \rangle$, the superscript + denotes an inverse or pseudo-inverse operation, and C is an N by K matrix $C_{nk}$ defined by $\langle \mathrm{Re}\, V_n, W_k \rangle$. The inverse or pseudo-inverse operation may be a Moore-Penrose pseudo-inverse.

In one embodiment, g is specified as $g = Ml$ where M is an N by K matrix and the matching criterion comprises computing M to minimise one or more error measures of the error function vector $E(f)$ defined by $E(f) = W(f) - M\,\mathrm{Re}\, V(f)$. An inner product denoted $\langle a, b \rangle$ may be an integral or sum over f between functions $a(f)$ and $b(f)$, and the one or more measures may incorporate $E(f)$ as at least one parameter $\langle \cdot, E \rangle$ in the inner product. The one or more error measures may incorporate $\langle E_k, E_j \rangle$ for at least some k,j. The one or more error measures may comprise $\langle E_k, E_k \rangle$ for each k and the condition may be minimisation respect to variation of M. The one or more measures may be $\langle W_k, E_k \rangle$ for each k and the condition may be $\langle W_k, E_k \rangle = 0$, whereby M satisfies the matching criterion as $M = C^+ \vartheta$, where the K by N matrix C is $C_{k,n} = \langle W_k, \mathrm{Re}\, V_n \rangle$, superscript + denotes an inverse or pseudo-inverse operation such as a Moore-Penrose pseudo-inverse and the K by K matrix $\vartheta$ is $\vartheta_{k,j} = \langle W_k, W_j \rangle$.

In one embodiment, the step of specifying the target magnitude frequency response further comprises dynamically altering the target magnitude frequency response according to user preferences or operation of a computational auditory perception model, and the step of computing the constrained frequency response further comprises dynamically updating computation of the constrained frequency response following the dynamic alteration of the target magnitude frequency response.

In one embodiment, the constraint preserved by concatenation is a minimum phase constraint.

In one embodiment, an integrand of the inner product integral or sum is multiplied by a weight function $\lambda(f)$ adapted to a desired frequency emphasis.

In one embodiment, at least one of the $V_n(f)$ comprises a derivative with respect to gain of a logarithm of a recursively implemented band filter frequency response.

In one embodiment, the steps of specifying the target magnitude frequency response and computing the constrained frequency response are repeatedly performed on demand.

In one embodiment, the temporal signal is an audio signal. In another embodiment, the temporal signal is a digital communication signal.

In accordance with a second broad aspect of the invention there is provided an apparatus for filtering a temporal signal, the apparatus comprising a digital signal processing device comprising:

a target magnitude frequency response specifier configured to specify a target magnitude frequency response $H_T(f)$ of frequency f in terms of a vector l of K weights $l_k$ where $\log H_T(f) = l^T W(f)$ and $W(f)$ is a vector of K magnitude basis functions $W_k(f)$;

a constrained frequency response determiner programmed to compute a constrained frequency response $H_c(f)$ defined by $\log H_c(f) = g^T V(f)$, where $V(f)$ is a vector of N constrained basis functions $V_n(f)$ for which each $\exp V_n(f)$ satisfies a constraint preserved by concatenation, and g is a vector of N rows satisfying a matching criterion between $l^T W(f)$ and $g^T V(f)$;

an input audio signal receiver interface to receive an input temporal signal;

a filter to filter the input temporal signal with the constrained frequency response $H_c(f)$ to form a filtered temporal signal; and a filtered temporal signal output interface to output the filtered temporal signal.

In embodiments of the apparatus, any and all features of the embodiments of the first broad aspect may be incorporated.

DETAILED DESCRIPTION OF EMBODIMENTS

Figure 1:
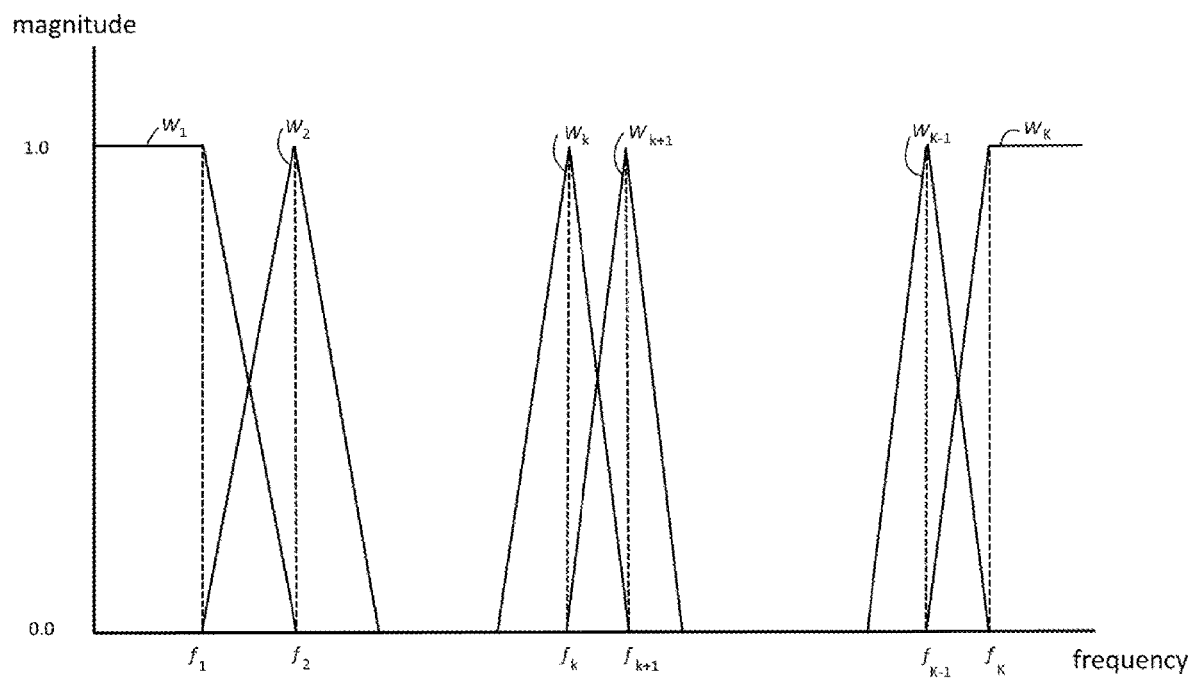
FIG. 1 is a depiction of target magnitude basis functions according to an embodiment of the invention.

Embodiments of the invention will now be described. It will be appreciated by person skilled in the art that practical embodiments of the invention are implemented in computer hardware, which may be realised in a number of ways. Fundamentally, the invention produces an improved minimum phase equalisation method and system, and the system typically involves programmed off-the-shelf components which are easily obtainable and selectable by person skilled in the art. Consequently most of the description herein concerns definition of the algorithms which define embodiments of the method, programming for which is easily transferred to computer implementation.

Functions including basis functions in this description and the claims are defined using the terminology of continuous functions of frequency, but the invention extends to discrete approximations. Functions are expressed in terms of frequency f (cycles per second), but may equivalently be expressed in terms of angular frequency $\omega = 2\pi f T$, where T is the time sampling interval of the digitally sampled audio signal, or any other form of frequency parameterisation.

The method of the invention is enabled by several independent realisations on how the problem may be simplified into a linear system. First, the problem of concatenating minimum phase filters to match an arbitrary target magnitude frequency response can be recast as a linear equation in terms of the logarithm of the frequency response. Concatenation of filter stages by multiplication to match a target frequency response transforms into sums of logarithms of filter stages. Second, because the Hilbert transform is a linear operator, the minimum phase constraint equation (1) on the real and imaginary parts of the logarithm of the frequency response is satisfied for any linear combination of basis functions with real coefficients, as long as the exponential of each basis function also satisfies (1). Third, suitable basis functions in the logarithmic domain can be derived from recursive filters due to the linearity property of the Hilbert transform in the logarithmic. Hereinafter we will refer to theses basis functions as constrained basis functions, to distinguish them from the basis functions used in relation to the target magnitude frequency response, discussed below and referred to as magnitude basis functions.

Constrained Basis Functions

Constrained basis functions in this embodiment are functions the exponential of which is minimum phase, and the gain parameter is a real multiplicative coefficient. The set of linear coefficients multiplying each constrained basis function defines the resultant constrained frequency response.

This may be expressed as $$\log H_c(f) = g^T V(f) \qquad (2)$$

where $H_c(f)$ is the constrained frequency response, $g^T$ is a transposed column vector $g$ of N gain weights $g_n$ and $V(f)$ is a column vector of N constrained basis functions $V_n(f)$.

Because the gain parameter $g_n$ is a linear coefficient and therefore the basis functions do not change as the gain parameters change, the overlap between basis functions is constant and the optimisation problem becomes a simple solution of a linear equation, the details of which depends on the matching criterion used to compare the constrained frequency response with the target magnitude frequency response.

Conveniently, suitable constrained basis functions may be chosen from known recursive minimum phase band filter stages and shelf filters, by making use of the linear nature of the minimum phase constraint equation (1). Specifically, consider a known minimum phase band filter stage function $H_n(f, \gamma_n, f_n, \Delta f_n)$ of frequency f, defined by parameters gain $\gamma_n$, centre peak frequency $f_n$ and bandwidth $\Delta f_n$. Since the minimum phase constraint is a linear constraint operating on the imaginary and real components of log $H_n$, the minimum phase constraint is also satisfied by its derivative with respect to log $\gamma_n$, being a limit of subtraction of two functions satisfying the minimum phase constraint, so long as log $\gamma_n$ is real ($\gamma_n \geq 1$). Therefore we may define $$L_n(f, f_n, \Delta f_n) \overset{def}{=} \frac{\partial}{\partial \log \gamma_n} \log H_n(f, \gamma_n, f_n, \Delta f_n) \Big|_{\gamma_n > 1 \to 1} \qquad (3)$$

and choose the constrained basis function $V_n(f)$ in the form $$V_n(f) = \frac{L_n(f, f_n, \Delta f_n)}{L_n(f_n, f_n, \Delta f_n)} \qquad (4)$$

An example choice of a class of recursive minimum phase functions $H_n(f, \gamma_n, f_n, \Delta_n)$ as the basis for the above calculation are the Zoelzer low shelf, high shelf and peak filters (Zoelzer, Digitale Audiosignalverarbeitung", ISBN 9783519261803 page 137). In order to preserve the minimum phase character of exp $g_n V_n(f)$, the coefficient $g_n$ is a real number if $V_n(f)$ is defined as above so that exp $V_n(f)$ is minimum phase. Clearly, opposite cancelling phase rotations in $g_n$ and $V_n(f)$ have no effect on the outcome.

A typical choice of the number N of the constrained basis functions $V_n(f)$ is slightly less than 100.

Notwithstanding the above convenient example, in general the constrained basis functions can be any functions the exponential of which satisfies the constraint, not necessarily functions representing single peaks. Any set of functions satisfying the constraint can be chosen which enable representation of a convenient range of constrained frequency responses to match the desired range of target magnitude frequency responses.

Target Magnitude Basis Functions

The logarithm of the target magnitude frequency response $H_T(f)$ which is a real function of frequency f, is specified in terms of a linear combination of K magnitude basis functions $W_k(f)$ multiplied by K positive or negative real weights $l_k$ using vector notation as follows:

$$\log H_T(f) = l^T W(f) \qquad (5)$$

The number K of magnitude basis functions and the form of each basis function is chosen to enable the desired freedom and smoothness in the functional form of $H_T(f)$ for the application. Conveniently, each $W_k(f)$ may be chosen as a triangle function with a peak of value 1 at a control point frequency $f_k$ linearly falling to zero at control point frequencies of neighbouring basis functions, except for the highest and lowest frequencies which may be better represented by shelf functions as depicted in FIG. 1. This produces a piecewise linear form of log $H_T(f)$ between the control points $l_k$, and has the advantage that log $H_T(f)$ can be easily specified by the user or system specifying the positive or negative control points $l_k$ or the actual positive target magnitude value exp($l_k$) at each control point frequency $f_k$. The control point frequencies $f_k$ do not need to be equally spaced and are conveniently closely spaced in frequency ranges of particular importance for accurate representation of log $H_T(f)$.

There is no restriction on the number of magnitude basis functions, the only practical limitation of which may be computational speed. A typical choice of the number of magnitude basis functions and corresponding control points is 100 or greater, which does not need to be the same as the number of constrained basis functions. The larger values of K, the higher the computational load but with modern computing power values of K up to 500 or more are feasible with the method of the invention, when applied to real-time adjustment of the frequency response.

Matching Criterion—Example 1

The method uses a matching criterion to define the degree of match between the constrained frequency response and the target magnitude frequency response and does not require any particular matching criterion for practical application, but variants are discussed herein by way of example.

First, it is useful to define an inner product of two functions $$<a,b> \overset{\Delta}{=} \int df \, a^*(f) b(f) \lambda(f) \qquad (6)$$

where the function λ(f) is an optional weighting function for providing different weighting of different frequencies in accordance with requirements of the application. Typically, λ(f)~1/f.

Using the inner product, the method may then define an error function being a measure of difference between the constrained frequency response and the target magnitude frequency response in terms of the basis functions, such as the real function $$e(f) \stackrel{\Delta}{=} l^T W(f) - g^T Re\ V(f) \qquad (7)$$

where exp $V_n(f)$ is normalized as minimum phase so that $g_n$ is real (see par 0038 above). Taking the real part advantageously also halves the computational load of solving the resulting equations.

A matching criterion can then be applied to the error function, in this example being minimisation of <e,e> with respect to variation of $g_k$, for which the stationary point is straightforwardly derived as g=Ml where M is a N by K matrix defined by inner products between the basis functions M=η$^+$C, η is an N by N matrix $η_{np}$ defined by <Re $V_n$, Re $V_p$>, the superscript + denotes an inverse or pseudo-inverse operation, and C is an N by K matrix $C_{nk}$ defined by <Re $V_n$, $W_k$>.

While for this matching criterion η is regular and its inverse $η^{-1}$ exists, for reasons of numerical stability the Moore-Penrose pseudo-inverse is preferred, because its use guarantees stability and produces a well-behaved solution even if η is close to ill-conditioned.

The matrix M may be calculated once, for a given choice of constrained basis functions $V_n(f)$ and magnitude basis functions $W_k(f)$, and stored in computer memory. In a typical implementation, there is no need for adjustment of the basis functions, although for general-purpose systems different choices of basis functions may be part of a system. The matrix M involves inner product integrals which are defined as integrals over a continuous frequency variable f, and are conveniently calculated using numerical integration techniques. Alternatively, in some instances analytical solutions to the integrals may be known or algebraically derived and may be directly programmed into the system. Further, as discussed above, the inner products may be implemented as discrete sums rather than integrals in their definition.

Choice of the real coefficients $l_k$ specifies the target magnitude frequency response, and calculation of the coefficients $g_n$ is therefore straightforward and deterministic knowing M. The actual constrained frequency response follows from (2) as $$H_c(f) = \exp(V^T(f)g) = \exp(V^T(f)Ml) \qquad (8)$$

Computation of Filtered Audio Signal

Techniques of the prior art are adapted to apply the constrained frequency response $H_c(f)$ to a digitally sampled audio signal x(n), briefly described here. $H_c(f)$ is approximately represented by a vector $H_{ci}$ evaluated at a discrete set of frequencies. The digital audio signal is temporarily buffered in memory and processed in chunks of length C samples and the Fast Fourier Transform (FFT) performed on each chunk to produce a FFT transformed signal $y_j$. In the inventors' current embodiment, the chunk length C (or C+R as discussed below) is typically 512 digital samples which at a sampling rate of about 50,000 samples per second comprises about 0.01 seconds of audio signal per chunk.

For the FFT, simple pointwise multiplication of the FFT transformed signal $y_j$ with a discretised frequency response filter $H_{ci}$ transforms via the inverse Fast Fourier Transform (iFFT) into a circular convolution in the time domain, introducing temporal aliasing artefacts. When a recursive filter is used in the prior art, temporal aliasing is avoided in the time domain by padding both the time series chunks x(n) of length C and the filter defined in the time domain by the impulse response h(n) of length R with trailing zeros to form equal length series each of length C+R. In this case, the computed filter $H_{ci}$ is the frequency response in the frequency domain and the operation in the frequency domain corresponding to padding of the impulse response in the time domain to size C+R is equivalently provided to choose C+R rather than R equally spaced frequencies for the discretization of $H_{ci}$. The C+R pointwize multiplication of $H_{ci}$ with the FFT transformed padded audio signal $X_j$, is then transformed back into the time domain with the iFFT to produce the filtered audio signal $y_i$ of length C+R in the time domain.

The filtered audio signal chunks of length C are constructed and joined using the overlap-add or overlap-save algorithms on the filtered chunks of length C+R. Further, in order to avoid artefacts generated by numerical discontinuities at the chunk boundaries, the input audio signal chunks of length C may also be constructed to overlap with a fading window applied to them so that all chunks add up to the original signal while fading in and out individually.

Because $H_c(f)$ is minimum phase and therefore has minimum impulse response tail, the appropriate value for R is well constrained and for the impulse response length is given by approximately at least 2π/F where F the smallest width of any of the band basis functions $V_n$, usually located at the lowest frequency band. The current implementation utilises R=10/F.

A highly efficient implementation for calculation of the filtered audio signal can be provided discretising the $V_n(f)$ to $V_{in}$ thereby expressing equation (8) directly in the discrete form $$H_{ci} = \exp(\Sigma_{n,k} V_{in} M_{nk} l_k) = \exp(\Sigma_k A_{ik} l_k) \qquad (9)$$

so the (C+R) by K matrix $A_{ik} = \Sigma_n V_{in} M_{nk}$ may be precalculated. In a system where $l_k$ may be dynamically changed, recalculation of $H_{ci}$ for each frequency i requires simply the multiplication $\Sigma_k A_{ik} l_k$ and a complex exponentiation, which may be performed easily in real-time, as defined by the elapsed time of a single chunk C.

Typically, one dedicated processor and architecture is used to continually process and produce the filtered audio signal based on application of a current value of the discretised frequency response $H_{ci}$, and a separate processor may be used to receive and calculate the updated $H_{ci}$ when the target magnitude frequency response represented by $l_k$ is changed either by direct user selection or the computed input of a psychoacoustic model.

Figure 2:
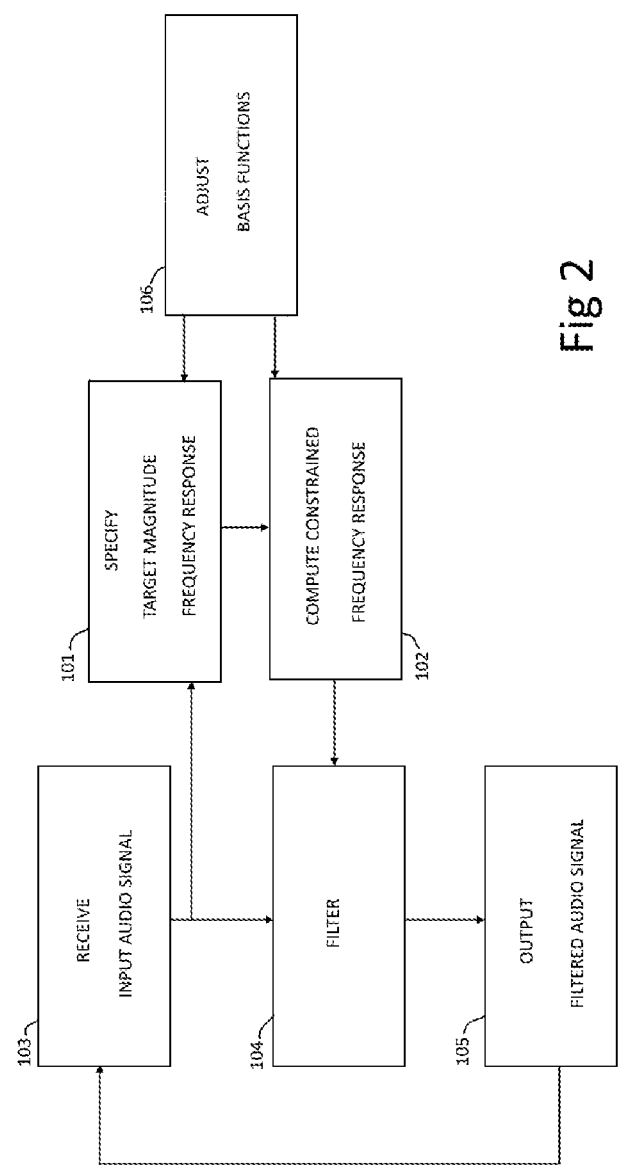
FIG. 2 is a diagram of the methods steps of an embodiment of the invention.

Referring now to FIG. 2 in the light of the above discussion, the method steps of the broadest aspect of the invention are depicted. In step 101 the step of specifying the target magnitude frequency response in terms of the vector l may be performed by interaction with a user manipulating the control points on an interactive graphical display, or by operation of a computational auditory perception model or machine learning model automatically deriving the vector l from the input audio signal, possibly also modulated by user selected parameters in relation to the computational auditory perception model.

Two examples of prior art computational auditory perception models are (1) a model as required by MPEG for MP3 compression encoding in order to calculate inter-band masking; and (2) standardised loudness models which provide a target magnitude magnitude frequency response based on a target loudness profile. An example of a machine learning model could be an automatic mechanism which learns how the time-varying spectral density of music behaves in music which is perceived by human listeners to be well-balanced, and then applies adjustments via the target magnitude frequency response to alter the spectral density of input music to improve the perceived balance.

Step 101 may thus be performed repeatedly. Upon update of the vector 1, in step 102 the constrained frequency response is calculated in accordance with the methods described. Steps 103, 104 and 105 are performed continually in a cycle on chunks of audio signal, usually in real-time, but in the broadest aspect of the invention the steps may be performed faster or slower than real-time in an off-line mode whereby the filtered audio signal may be output to a memory for later playing and reproduction on a sound system. In step 103, the input audio signal is received from a source, preferably in digital form. It will be understood that the source in the broadest aspect is unrestricted, and can be for example a microphone pick up, a synthesised audio signal, a locally stored audio signal or an audio signal streamed over a network from a remote location. The source may also be provided by a digital audio workstation host software application which also acts as the routing destination for the output and potential source of a sidechain control signal.

Typically, the input audio signal is stored in a buffer for processing chunk by chunk. In step 104, each chunk of the input audio signal is filtered by applying the constrained frequency response to produce and join chunks of filtered audio signal, exemplified by the methods described above. In step 105, the filtered audio signal is output chunk by chunk to audio hardware for listening or stored for later reproduction. In one embodiment, optional step 106 comprises user adjustment of one or more of the basis functions $W_k(f)$ or $V_n(f)$, or the associated weighting function $\lambda(f)$. This may be desired if a new application requires increased detail of the target magnitude frequency response in a particular frequency range, or sensitivity of the matching criterion to a particular frequency range.

Figure 3:
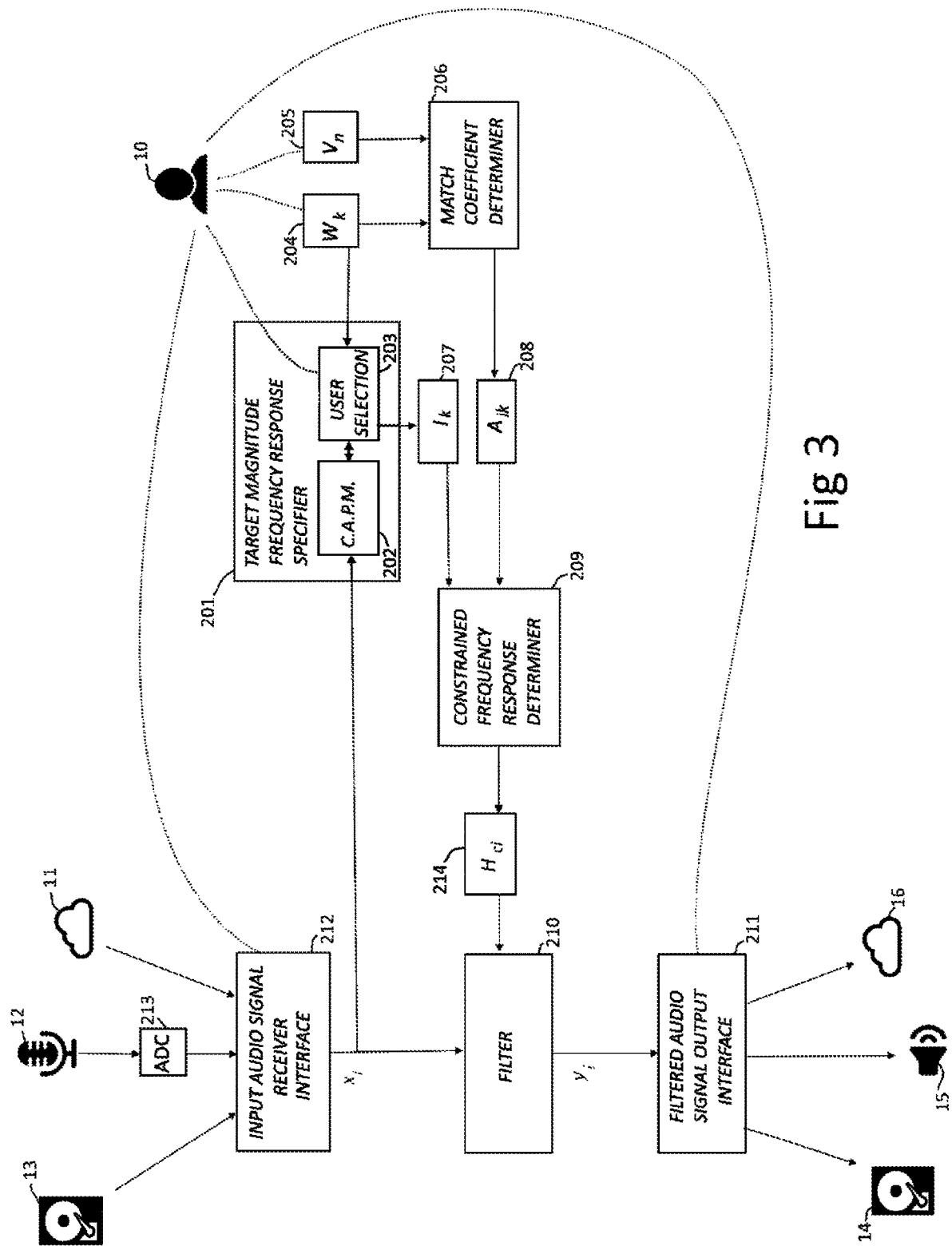
FIG. 3 is a functional block diagram of components of an embodiment of the apparatus of the invention.

Referring now to FIG. 3, a functional block diagram of an apparatus implementing the method of the invention is shown. It will be appreciated that the functional blocks are implemented in computer hardware which may form software modules executed on a single processor, or may be distributed amongst different special processors and memory architectures. Generally, hardware configurations known in the art for digital signal processors performing graphic equalisation are suited for adaptation in the method of the invention, the application of which is primarily brought into effect by software modules implementing the methods of the invention. Solid lines with arrows between modules indicate data flow, and dotted lines indicate user interaction.

An input audio signal receiver interface 212 which may be under selection by user 10 selects an input audio signal from a source, which may be a stored audio signal on digital memory 13 which may be sent from a digital audio workstation (which may be implemented as a software program running on a general purpose on a computer) or from a remote source via a remote network 11 such as the Internet, or a live audio pickup via microphone 12 and an analog to digital converter 213. Chunks of digital data series $x_i$ of the input audio signal are received by filter 210 and filtered with the discretised minimum phase frequency response $H_{ci}$ stored in constrained frequency response memory 214, using the fast linear convolution FFT algorithms of the prior art as described above to produce chunks of digital data series $y_i$ of the filtered audio signal. Filtered audio signal output interface 211 then outputs the filtered audio signal to one or more output destinations under selection by user 10 such as to a storage on digital memory 13 which may be in a digital audio workstation or from a remote source via a remote network 11 such as the Internet or to an audio system 15 to produce sound.

Target magnitude frequency response specifier 201 allows adjustment of the target magnitude frequency response $H_T(f)$ via specification of the K weights $l_k$ stored in magnitude weight memory 207, by direct user selection of the weights which as described above may be control points capable of selection on a graphical interface depicting the target magnitude frequency response curve, by automatic operation of a computational auditory perception model 202 or a machine learning model which may process the input audio signal $x_i$ to determine characteristics of the audio signal for input into the model 202, and which may also be under user selection in respect of user-specifiable parameters of the model.

As described above in relation to FIG. 2, user modification may also be provided in relation to the magnitude basis functions $W_k(f)$ stored in magnitude basis function memory 204 and/or the constrained basis functions $V_n(f)$ stored in constrained basis function memory 205, or of the weight function $\lambda(f)$ (not shown). Upon modification of any of the basis functions or weight function, match coefficient determiner 206 operates the algorithms and formulas described above in relation to the matching criterion to compute an updated matrix $A_{ik}$ to be stored in match coefficient memory 208.

Upon modification of the magnitude weights $l_k$ or the match coefficient matrix $A_{ik}$, constrained frequency response determiner 209 computes the discretised constrained frequency response $H_{ci}$ using formula (9) and stores the result in constrained frequency response memory 214.

In the current implementation of the inventors, the software is written in generic C++ code and Intel 64-bit architecture is used, without the need for dedicated digital signal processing hardware. Other implementations could incorporate ARM, dedicated DSP hardware or even low-level logic devices such as FPGAs or ASICs.

Other Matching Criteria Examples

There are many other matching criteria which generally produce a small error value and therefore can in practice produce adequate matching results. For example, we may require a solution of the form g=Ml where M is an N by K matrix and the error function e(f) from equation (7) becomes $1^T E(f)$ with the error vector E(f) defined as $E(f)=W(f)-M^T \text{Re} V(f)$ and factoring out $1^k$ we can define a matching criterion involving each $E_k(f)$.

With this approach, using a matching criterion varying M to minimise $<E_k, E_k>$ for each k, results in the same outcome as example 1 above.

Alternatively, using a non-variational matching criterion $<W_k, E_k>=0$ for each k results in the equation $M=C^+\vartheta$, where the K by N matrix C is $C_{k,n}=<W_k, \text{Re } V_n>$, superscript + denotes a generalised inverse and the K by K matrix $\vartheta$ is $\vartheta_{k,j}=<W_k, W_j>$. In this case, C is in general not invertible and the Moore-Penrose pseudo-inverse may be necessary rather than desirable, giving a least-squares approximation fit. While this example may not provide as close a match in some circumstances as example 1, the result is mostly acceptable and it will be appreciated that many other variant matching criteria along similar lines are possible.

Concluding Remarks

Persons skilled in the art will appreciate that many variations may be made to the invention without departing from the scope of the invention, which is determined from the broadest scopes and claims.

For example, while the invention is conceived primarily with respect to implementation of minimum phase audio signal filters, other constraint criteria are within the broadest scope of the invention, which can be applied to any constraint which survives concatenation of the exponential of the constrained basis functions, i.e. which survives linear combination of the constrained basis functions. Constraint criteria which are approximately minimum phase are also within the scope of the invention.

Further, while the examples above recite particular error functions and error vectors, other means of matching the linear combination of target magnitude and constrained basis functions is within the broadest scope of the invention.

Further still, while the examples above relate to audio signals, as discussed on page 1 of this description the applications extend in the broadest aspect of the invention to temporal signals which are not audio signals, such as digital communications signals where persons skilled in the art will appreciate that the methods of the invention can be equally applied to adaptive channel equalisation, where the aim is to improve the quality of a digital signal.

Further also, in the broadest aspect of the invention the temporal signal may be a physical signal or a synthesised signal.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention. Further, any method steps recited in the claims are not necessarily intended to be performed temporally in the sequence written, or to be performed without pause once started, unless the context requires it.

It is to be understood that, if any prior art publication is referred to herein, such reference does not constitute an admission that the publication forms a part of the common general knowledge in the art, in Australia or any other country.

The invention claimed is:

1. A method of filtering a temporal signal, the method comprising implementing on a digital signal processing device the steps of:
    specifying a target magnitude frequency response $H_T(f)$ of frequency f in terms of a column vector l of a number K of weights $l_k$ where $\log H_T(f)=l^T W(f)$ where $l^T$ is the vector transpose of l and W(f) is a column vector of K magnitude basis functions $W_k(f)$;
    computing a constrained frequency response $H_c(f)$ defined by $\log H_c(f) = g^T V(f)$, where V(f) is a column vector of a number N of constrained basis functions $V_n(f)$ for which each $\exp g_n V_n(f)$ satisfies a constraint preserved by concatenation, and $g^T$ is vector transpose of a column vector g of N coefficients $g_n$ satisfying a matching criterion between $l^T W(f)$ and $g^T V(f)$;
    receiving an input temporal signal;
    filtering the input temporal signal with the constrained frequency response $H_c(f)$ to form a filtered temporal signal; and
    outputting the filtered temporal signal.

2. The method of claim 1, wherein the matching criterion is a condition on one or more error measures between $l^T W(f)$ and $g^T V(f)$.

3. The method of claim 2, wherein the one or more error measures comprises an error measure an error function e(f) defined by $l^T W(f)-g^T \text{Re } V(f)$.

4. The method of claim 3, wherein the condition of the matching criterion is a minimization with respect to variation of g, and the error measure of the error function e(f) is an inner product <e,e> where for any functions a(f) and b(f), the inner product denoted <a,b> is an integral or sum over f between a(f) and b(f), whereby g satisfies the matching criterion as Ml, where $M=\eta^+ C$, $\eta$ is an N by N matrix $\eta_{np}$ defined by <Re $V_n$, Re $V_p$>, where Re denotes real part, $\eta^+$ denotes an inverse or pseudo-inverse of $\eta$, and C is an N by K matrix $C_{nk}$ defined by <Re $V_n$, $W_k$>.

5. The method of claim 4, wherein the inverse or pseudo-inverse is a Moore-Penrose pseudo-inverse.

6. The method of any one of claims 1 to 3, wherein g is specified as g=Ml where M is an N by K matrix and the matching criterion comprises computing M to satisfy a condition on one or more error measures of an error function vector E(f) of K error functions defined by $E(f)=W(f)-M^T \text{Re } V(f)$.

7. The method of claim 6, wherein for any functions a(f) and b(f), the inner product an inner product denoted <a,b> is an integral or sum over f between a(f) and b(f), and the one or more error measures incorporate E(f) as at least one of the functions in the inner product.

8. The method of claim 7, wherein the one or more error measures incorporate <$E_k$, $E_j$> for at least one pair of values k,j between 1 and K.

9. The method of claim 8, wherein the one or more error measures comprise <$E_k$, $E_k$> for each value k between 1 and K, and the condition is minimisation minimization respect to variation of M.

10. The method of claim 7, wherein the one or more measures is <$W_k$, $E_k$> for each value k between 1 and K and for each value n between 1 and N, and the condition is <$W_k$, $E_k$>=0 whereby M satisfies the matching criterion as $M=C^+ \vartheta$, where C is a K by N matrix having elements $C_{k,n}$=<$W_k$, Re$V_n$> for each value k between 1 and K and for each value n between 1 and N, $C^+$ is an inverse or pseudo-inverse of C and $\vartheta$ is a K by K matrix having elements $\vartheta_{k,j}$=<$W_k$, $W_j$> for each pair of values k,j between 1 and K.

11. The method of claim 10, wherein the inverse or pseudo-inverse is a Moore-Penrose pseudo-inverse.

12. The method of claim 1, wherein:
    the step of specifying the target magnitude frequency response further comprises dynamically altering the target magnitude frequency response according to user preferences or operation of a computational auditory perception model, and
    the step of computing the constrained frequency response further comprises dynamically updating computation of the constrained frequency response following the dynamic alteration of the target magnitude frequency response.

13. The method of claim 1, wherein the constraint preserved by concatenation is a minimum phase constraint.

14. The method of claim 4, wherein an integrand of the inner product integral or sum is multiplied by a weight function $\lambda(f)$ adapted to a desired frequency emphasis.

15. The method of claim 1, wherein at least one of the $V_n$(f) comprises a derivative with respect to gain of a logarithm of a recursively implemented band filter frequency response.

16. The method of claim 1, wherein the steps of specifying the target magnitude frequency response and computing the constrained frequency response are repeatedly performed on demand.

17. The method of claim 1, wherein the temporal signal is an audio signal or a digital communication signal.

18. The method of claim 17, wherein the temporal signal is an audio signal.

19. An apparatus for filtering a temporal signal, the apparatus comprising a digital signal processing device comprising:

a target magnitude frequency response specifier configured to specify a target magnitude frequency response $H_T(f)$ of frequency f in terms of a column vector l of a number K of weights $l_k$ where $\log H_T(f) = l^T W(f)$ where $l^T$ is a vector transpose of l and $W(f)$ is a column vector of K magnitude basis functions $W_k(f)$;

a constrained frequency response determiner programmed to compute a constrained frequency response $H_c(f)$ defined by $\log H_c(f) = g^T V(f)$, where $V(f)$ is a column vector of a number N of constrained basis functions $V_n(f)$ for which each $\exp g_n V_n(f)$ satisfies a constraint preserved by concatenation, and g is a column vector of N coefficients satisfying a matching criterion between $l^T W(f)$ and $g^T V(f)$, where $g^T$ is a vector transpose of g;

an input temporal signal receiver interface to receive an input temporal signal;

a filter to filter the input temporal signal with the constrained frequency response $H_c(f)$ to form a filtered temporal signal; and a filtered temporal signal output interface to output the filtered temporal signal.

\* \* \* \* \*